United States Patent [19]
Laot et al.

[11] Patent Number: 5,363,063
[45] Date of Patent: Nov. 8, 1994

[54] AMPLIFIER WITH AN OUTPUT CURRENT LIMITER

[75] Inventors: Colette Laot; Bernard Majoux, both of Meylan, France

[73] Assignee: SGS-Thomson Microelectronics S.A., Saint-Genis Pouilly, France

[21] Appl. No.: 61,181

[22] Filed: May 13, 1993

[30] Foreign Application Priority Data

May 18, 1992 [FR] France .................. 92 06384

[51] Int. Cl.⁵ .................. H03F 1/52; H04M 19/00
[52] U.S. Cl. ..................... 330/298; 330/264
[58] Field of Search ............ 330/207 P, 264, 265, 330/269, 298

[56] References Cited

FOREIGN PATENT DOCUMENTS

WOA-9009703 8/1990 WIPO .

OTHER PUBLICATIONS

IEEE International Solid State Circuits Conference, vol. 24, Feb. 1981, New York, US, pp. 246–277, D. W. Aull et al., "Telecommunication Circuits".

Primary Examiner—William L. Sikes
Assistant Examiner—Fetsum Abraham
Attorney, Agent, or Firm—Wolf, Greenfield & Sacks

[57] ABSTRACT

An amplifier is provided in an integrated circuit in MOS technology. To ensure current limitation of a push-pull type stage when the internal resistance of the output transistors is not sufficient to ensure the limitation, there is provided a circuit including a resistor for detecting whether the current value is exceeded; a limiting transistor connected across the resistor for detecting the overcurrent; a transistor for duplicating current in the limiting transistor and a resistor biasing this transistor; a connection between the duplicating transistor and the amplifier input; and an isolation transistor between the duplicating transistor and the amplifier input.

20 Claims, 2 Drawing Sheets 5,363,063

AMPLIFIER WITH AN OUTPUT CURRENT LIMITER

BACKGROUND OF THE INVENTION

1. Field of the Invention

The present invention relates to integrated circuits, more particularly, but not exclusively, to integrated circuits realized in M0S (Metal Oxide Semiconductor) or BIMOS (BIpolar and Metal Oxide Semiconductor) technology.

2. Discussion of the Related Art

It may be necessary to limit the output current to avoid destruction of an integrated circuit amplifier in case of shorting at the amplifier output, or even in case a load having a too low impedance is connected at the output.

Such output current limiting means are not necessarily implemented by specific circuit components. Indeed, in M0S technology, for example, the output stage of the amplifier is typically formed by an AB-class amplifier having a threshold gain equal to 1. M0S transistor technology is such that the internal resistor of a transistor, even at the maximum conduction state, limits the current to a reasonable value (which depends on its geometry), even if the output is shorted. If the shorting current is still too high with respect to the value that can be withstood by the transistor, it would still be possible to insert a resistor between the supply terminal and the source of the transistor.

However, in some circuits, this type of limiter is no longer possible, such as in the case of amplifiers in which it is desired to have a very high output voltage range, that is, to have extreme values very close to supply voltage values. By way of example, if the supply voltages are respectively 0 and 10 volts, it is desired that the output voltage of the amplifier can come within 50 or 100 mV of these values with a 10-kΩ charge, or within 600 mV of these values with a 600-Ω charge.

The circuits of this type do not allow, a priori, to insert a limiting resistor in the source of the output transistors because such a resistor automatically decreases the output voltage range of the amplifier, proportionally to the resistor value. Additionally, such circuits theoretically require large-size output transistors, capable of conducting a high current; hence, such transistors will not be operable to automatically limit the current to a moderate value in case of shorting.

An object of the invention is to realize an amplifier including means for limiting the output current that can be provided by the amplifier.

SUMMARY OF THE INVENTION

The invention provides an active current limiting circuit which allows, as efficiently as possible and without secondary drawbacks ( such as instability phenomena or risks of oscillations), for limiting the output current while maintaining an output voltage range as high as possible.

An amplifier according to the invention includes an output stage and a current limiting circuit. The output stage includes two output transistors, in series between two supply terminals, and at least one first control terminal for controlling the conduction of the first transistor. The current limiting circuit includes a resistor in series between a stage output and the junction between the two output transistors, and at least one limiting transistor having its gate connected to a terminal of the resistor and its source connected to the other terminal. The drain of the limiting transistor is connected to a transistor connected as a diode. The limiting transistor conducts a current when the output current in the resistor exceeds a predetermined value in a first direction. Additionally, there is provided a transistor for duplicating the current into the diode-connected transistor. The drain of the duplicating transistor is connected through an isolation transistor to the first control terminal. Moreover, the isolation transistor is connected so as to be turned on when the current in the limiting transistor exceeds a predetermined threshold.

Preferably, the isolation transistor has its source connected to the drain of the duplicating transistor, its drain connected to the first control terminal, its gate connected to the gate of the duplicating transistor, and its substrate connected to the most negative voltage of the circuit (when this isolation transistor is an N-channel transistor).

In practice, the drain of the duplicating transistor is connected to a supply voltage source through a resistor.

To allow the limiting circuit to also operate when the output current flows in the reverse direction through the resistor, preferably, a second limiting transistor is provided, with its gate and its source respectively connected to a terminal of the output resistor. The second limiting transistor is rendered conductive when the current in the resistor exceeds a predetermined value (in a reverse direction with respect to the direction of the current that renders the first limiting transistor conductive). To achieve this purpose, the drain of the second limiting transistor is connected so as to act on a second control terminal of the circuit, in a direction appropriate to decrease the current in the second output transistor when a tolerable maximum value of the output current is exceeded.

Although the invention relates more particularly to an amplifier realized in MOS or BIMOS technology, it can also be applied to a circuit using bipolar transistors only.

The foregoing and other objects, features, aspects and advantages of the invention will become apparent from the following detailed description of the present invention which should be read in conjunction with the accompanying drawings.

DETAILED DESCRIPTION

A conventional AB class output stage of an operational amplifier realized in CMOS technology generally includes (refer to FIG. 1) two output terminals T1 and T2, having opposite or similar conductivity types, in series between two supply terminals Vcc and Vss of the circuit. In the described example, a P-channel transistor, T1, having its drain connected to Vss and an N-channel transistor, T2, having its drain connected to terminal Vcc, are provided. However, the invention applies to different configurations of AB class amplifiers (P-channel transistor connected to Vcc, or transistors of the same conductivity type).

The active current limiter according to the invention first includes a resistor R disposed between the output S of the stage and a node A which is the junction between the two transistors T1 and T2. The output current of the amplifier flows through the resistor.

The signal to be amplified is applied to an input E of an intermediate stage of the amplifier. Here, this intermediate stage includes transistor T3, diodes D1, D2, and current source SC. The intermediate stage controls the output stage by acting on the gates of transistors T1 and T2. In the described example, transistor T3 is an N-channel transistor and has its source connected to Vss, its drain being connected to a load formed by the two diodes D1 and D2 in series with the current source SC. The current source SC biases the two diodes in a forward direction. The gate of T1 is directly connected to the drain of T3. The gate of T2 is connected to the junction between the current source SC and the diodes. This arrangement maintains, between the gates of T1 and T2, a voltage difference equal to the forward voltage drop in the diodes, i.e., approximately 1.4 volts.

Thus, transistor T3 acts upon transistors T1 and T2 to modify their conduction; the action on the conduction of T1 is made in a direction opposite to the action on T2 since the transistors are of the opposite conductivity type and receive variations having the same direction at their gate.

Within this disclosure the terms "first control terminal" should be construed as input E and "second control terminal" as node F which is formed by the gate of transistor T2. It will be seen that the limiting circuit according to the invention acts on these two points to limit the output current of the amplifier.

Figure 1:
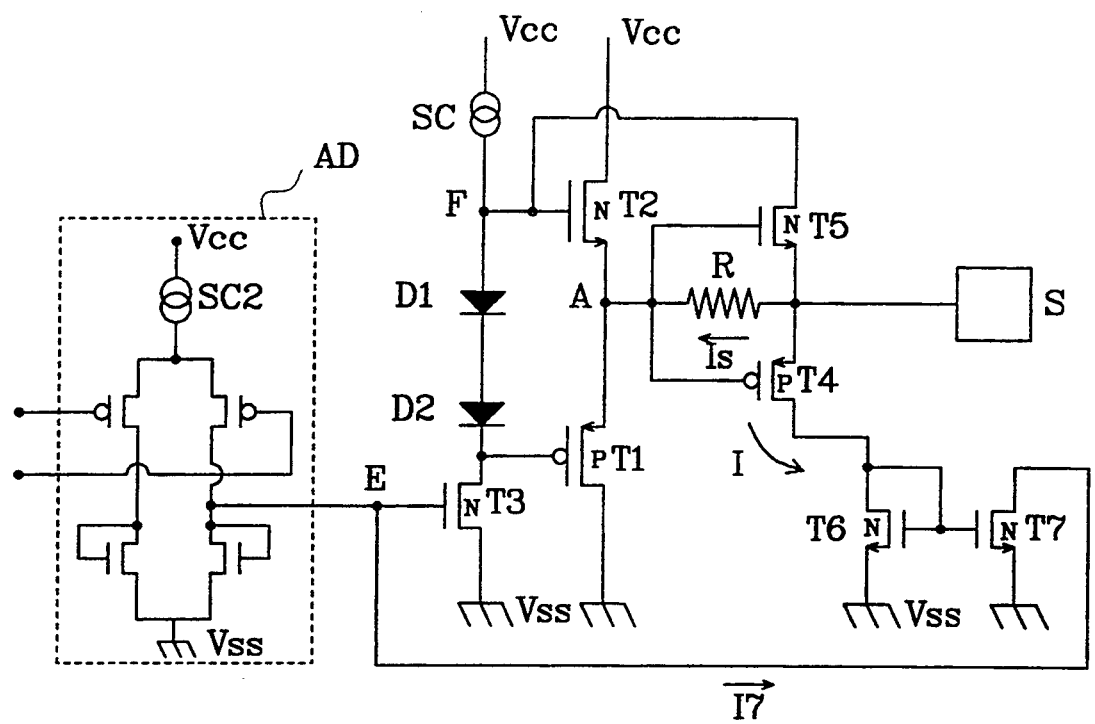
FIG. 1 shows a block diagram of an amplifier including the invention.

The limiting circuit provided in FIG. 1 includes, in addition to resistor R, two transistors T4 and T5. T4 is a P-channel transistor, and T5 is an N-channel transistor; both transistors have their gate connected to node A and their source connected to output S. It should be noted that it is possible to reverse the connection directions of these transistors provided that their conductivity type is also reversed: the connection direction should be chosen so as to decrease the conduction of the output transistor which tends to conduct too high a current.

It will be appreciated that if the output current flowing in resistor R exceeds a predetermined threshold, the gate-source voltage drop of the limiting transistors T4 and T5 will exceed the conduction threshold of these transistors. For the P-channel transistor T4, the conduction threshold will be exceeded for an incoming current, from terminal S to terminal A, whereas, for the N-channel transistor T5, the conduction threshold will be exceeded for an outgoing current, from terminal A to terminal S.

The drain of transistor T5 serves to control the decrease of the conduction of transistor T2. This drain can be connected directly to the gate of transistor T2, that is, to the second control terminal F. If the conduction threshold of T5 is exceeded because of a too low load impedance for the outgoing current, setting of T5 into conduction decreases the gate voltage of the N-channel transistor T2 and decreases the outgoing current which is precisely provided by transistor T2.

On the contrary, the drain of transistor T4 is operable to control the conduction of transistor T1 when the incoming current is exceeded. However, in the described example, this drain cannot be connected directly to the control gate of T1 because setting into conduction of transistor T4 would cause the gate voltage of transistor T1 to increase if the drain of T4 were connected directly to the gate of T1.

Therefore, in this embodiment, the drain of transistor T4 is connected to a current mirror formed by two transistors T6 and T7. The N-channel transistor T6 is connected as a diode (with interconnected gate and drain), and is connected between the drain of T4 and Vss. Transistor T7 is a transistor duplicating the current (which is the same as the current of transistor T4) into transistor T6. The gates of T6 and T7 are interconnected and their sources are connected to Vss. The drain of transistor T7 is used to control the conduction of transistor T3 of the intermediate stage and, hence; the conduction of transistor T1. The simplest approach is to connect directly the drain of transistor T7 to the gate of transistor T3 (circuit of FIG. 1). Additionally, the gate of transistor T3 receives, at the control terminal E to which it is connected, an input signal to be amplified.

This signal to be amplified is generated, for example, by the output of a differential amplifier AD having two differential legs fed by a common current source SC2.

Setting of transistor T4 into conduction, when the threshold value of the incoming current is exceeded, generates a current I in transistor T6 and, therefore, a theoretically identical current I7=I in transistor T7 (if the duplication ratio between transistors T6 and T7 is 1). Current I7 is drawn from input E, that is, it comes from the output leg of the differential amplifier AD connected to the input E. As soon as this current exceeds the maximum current that can be provided by the output leg of the differential amplifier AD, the voltage of input E drops, resulting in an increase of the gate voltage of transistor T1 and therefore a decrease of the conduction of the latter.

Thus, the amplifier incoming current is effectively limited.

However, the circuit of FIG. 1 may exhibit drawbacks that can result from the progressive implementation of the current limitation.

Figure 2:
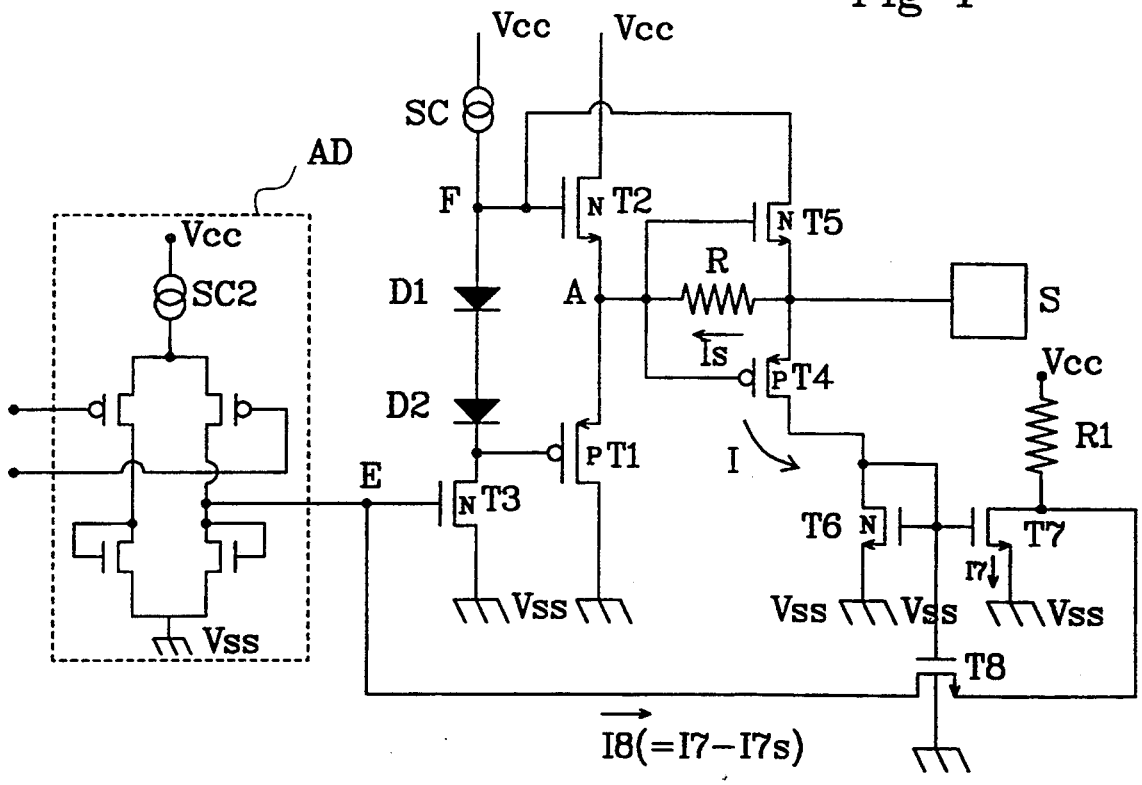
FIG. 2 shows an amplifier circuit according to a preferred embodiment of the invention.

According to a preferred embodiment shown in FIG. 2, this drawback is avoided by providing an additional isolation transistor T8, which is operable to disconnect transistor T7 from input E as long as transistor T4 is still partially set into conduction. Transistor T8 is then rendered clearly conductive as soon as the current in transistor T4 exceeds a predetermined threshold.

Accordingly, when incoming current is not exceeding a tolerable threshold in the output stage, and also during the limit phase when the output current in resistor R begins to render transistor T4 conductive, there is practically no feedback from the output to the input, which is advantageous to solve problems inherent in instability.

On the contrary, when transistor T4 exceeds a given conduction threshold, transistor T8 becomes abruptly conductive, transistor T7 then absorbs a sufficient current to decrease the voltage of input E (this occurs when transistor T7 absorbs the whole current that the output of amplifier AD can provide).

In the preferred embodiment of FIG. 2, the drain of the duplicating transistor T7 is in addition connected by a resistor R1 to the positive supply terminal Vcc. Although resistor R1 is not strictly necessary for the current limiter circuit to operate, such resistor improves the circuit's stability by introducing a feedback time constant in the loop formed by the current limiting circuit.

Preferably, transistor T8 has its gate connected to the gate of transistors T6 and T7, its source connected to the drain of transistor T7 and its drain connected to input E. Moreover, it is desirable that the substrate of transistor T8 (that is, the semiconductor region in which are diffused the source and drain of this transistor) is connected to the lowest voltage (Vss) of the circuit instead of being connected to the source or being floating.

The circuit operates as follows when the output current Is (in the incoming direction) approaches the maximum tolerable value: current Is generates a voltage R.Is across resistor R. When this voltage reaches the threshold voltage Vt4 required for setting transistor T4 into conduction, the latter starts conducting a current I which flows through transistor T6. The current of transistor T6 is duplicated in the form of a current I7 in transistor T7. At the beginning, the source voltage of transistor T8 is too high and its gate voltage too low for transistor T8 to conduct. Therefore, the current of transistor T7 is only provided by resistor R1 and produces in this resistor a voltage drop R1.I7.

There exists a current threshold for transistor T4 for which the following conditions occur. The gate voltage of T6 and T7, thus of T8, is high enough because T6 and T7 conduct a current, and the source voltage of T8 is low enough because of the voltage drop R1.I7 in resistor R1, so that the gate-source voltage Vgs8 of transistor T8 exceeds the conduction threshold Vt8 of transistor T8. Then, T8 becomes clearly conductive because the slightest increase of current I in transistor T4 highly increases the gate-source voltage of T8.

In addition, the size of transistor T8 is selected to be relatively small with respect to transistor T7 so that T8 is clearly conductive as soon as the voltage drop in R1 is practically equal to Vcc.

Then, the conduction of T8 draws a current from input E and directs this current into transistor T7.

The transistors are designed in such a way that the current I8 drawn by transistor T8 is very rapidly higher than the maximum current available at input E. When input E is controlled by the differential amplifier AD, the circuit is accordingly designed so that the current drawn by T8 is easily higher than the maximum current that can be provided by the output leg of the differential amplifier AD. The voltage at input E then drops and interrupts the conduction of transistor T3, and therefore the conduction of transistor T1.

If Vgs7 be the gate-source voltage of transistor T7 conducting by a current I7s at the very moment when transistor T8 is becoming conductive, and Vt8 the conduction threshold voltage of T8, then conduction of transistor T8 occurs for a current threshold I7s equal to (Vcc−Vgs7+Vt8)/R1.

Setting into conduction of T8 occurs when current I in T4 exceeds the value which generates (by duplication) a current I7s in T7. Assuming that the current duplication coefficient between T6 and T7 is 1, then value I=I7s =(Vcc+Vgs7−Vt8)/R1 represents the current threshold in transistor T4 for which the current limitation is effectively obtained.

Figure 3:
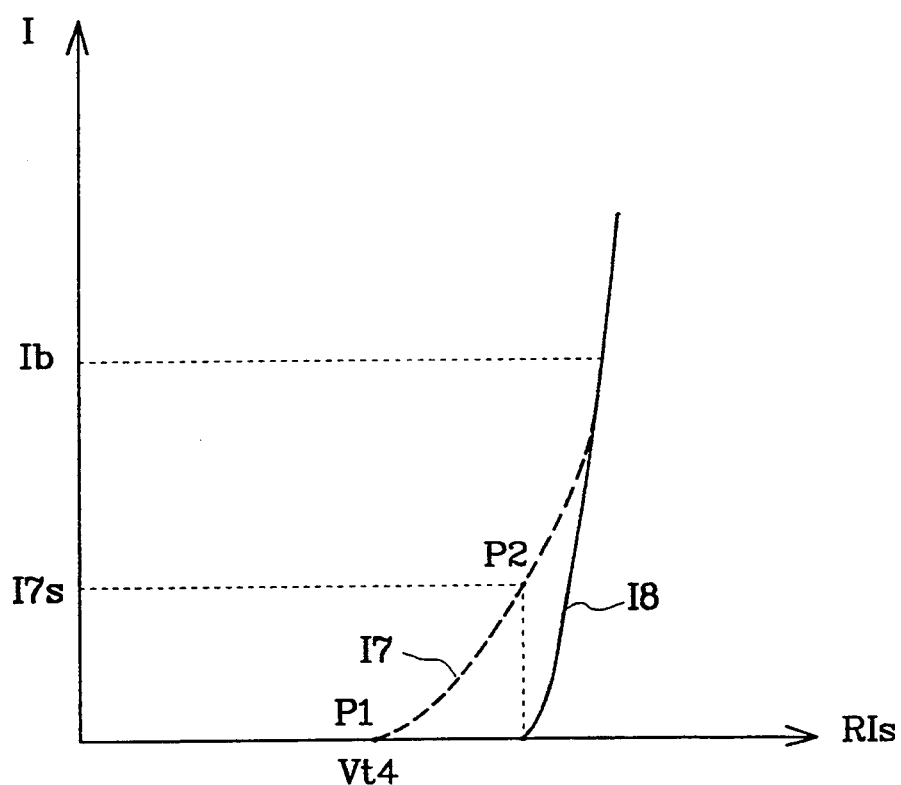
FIG. 3 is a curve illustrating the advantages of the circuit of FIG. 2.

FIG. 3 shows curves of the variations of current I8 in transistor T8 as a function of the output current Is of the amplifier or of the voltage R.Is across resistor R. The curve drawn in dotted lines shows the variation of I7 in a circuit as shown in FIG. 1, whereas the curve drawn in solid lines represents the variation of I8 in the circuit of FIG. 2. The advantage of the configuration of FIG. 2 is very clear: the current I8 is practically zero below a given threshold (higher than in the example of FIG. 1, which means that the value of resistor R must be selected as a function of which limiter circuit is used). Current I8 very rapidly increases beyond this threshold. A whole area (drawn in dotted lines), liable to generate misoperation, has been eliminated because the partial current limitation introduced a detrimental feedback loop in the amplifier. On the curves of FIG. 3, point P1 shows the beginning of the setting into conduction of transistor T4 and point P2 shows a current threshold in T4 (or, by current duplication, in T7) which corresponds to the threshold of the setting into conduction of transistor T8 in the circuit of FIG. 2.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is not intended as limiting. The invention is limited only as defined in the following claims and the equivalents thereto.

What is claimed is:

1. An amplifier comprising an output stage and a current limiting circuit, said output stage including two output transistors in series between two supply terminals, and at least one first control terminal for controlling the conduction of the first transistor; and the current limiting circuit including a resistor in series between an output of the output stage and a junction between the two output transistors, with at least one limitation transistor having a gate connected to one terminal of the resistor and a source connected to another terminal, wherein:

the limitation transistor has a drain connected to a transistor, connected as a diode, and conducting a current when an output current in the resistor exceeds a predetermined value in a first direction;

an additional duplicating transistor duplicates a current in the diode-connected transistor, a drain of the transistor being connected through an isolation transistor to the at least one first control terminal;

the isolation transistor is connected so as to be rendered conductive when the current in the limitation transistor exceeds a predetermined threshold.

2. The amplifier of claim 1, wherein the isolation transistor has a source connected to the drain of the duplicating transistor, the drain of the isolation transistor also being connected to the first control terminal, a gate of the isolation transistor being connected to a gate of the duplicating transistor, and a substrate connected to the most negative voltage of the circuit when said isolation transistor is an N-channel transistor.

3. The amplifier of claim 2, wherein the drain of the duplicating transistor is connected to a supply voltage source through a resistor.

4. The amplifier of claim 1, wherein there is provided a second limitation transistor having a gate and a source respectively connected to a terminal of the output resistor, the second limitation transistor being rendered conductive when the output current in the resistor exceeds a predetermined value in a reverse direction of the current which renders the first limitation transistor conductive, a drain of the second limitation transistor being connected so as to act on a second control terminal of the circuit, in a direction appropriate to decrease the current in the second output transistor when the output current exceeds the predetermined value.

5. The amplifier of claim 4, wherein the drain of said second limitation transistor is directly connected to a gate of the second output transistor.

6. The amplifier of claim 5, wherein the first control terminal is the gate of an amplifying transistor having a drain connected to the gate of the first output transistor.

7. The amplifier of claim 6, wherein a second control terminal is connected to the drain of the amplifying transistor through an assembly of diodes which are biased in a forward direction.

8. The amplifier of claim 7, wherein one of said limitation transistors is a P-channel transistor, and the other is an N-channel transistor.

9. A current limiter for connection to a push-pull amplifier stage including a first output transistor, a second output transistor, an input and an output, comprising:
 a resistor coupled between the output and an output terminal;
 a first limitation transistor coupled between the resistor and the first output transistor, the first limitation transistor controlling conduction of the first output transistor so as to reduce an output current supplied by the first output transistor when a current flowing through the resistor exceeds a predetermined value in a second direction;
 a second limitation transistor coupled to the resistor; and
 a current mirror circuit coupled between the second limitation transistor and the input, the current mirror circuit controlled by the second limitation transistor to reduce a current supplied to the input when a current flowing through the resistor exceeds the predetermined value in a first direction.

10. The current limiter of claim 9, wherein the current mirror circuit includes a first diode-connected transistor coupled to the second limitation transistor and a duplicating transistor, coupled to the diode-connected transistor and the input that duplicates a current flowing in the diode-connected transistor.

11. The current limiter of claim 10, further comprising an isolation transistor, coupled between the current mirror circuit and the input and controlled by the current mirror circuit to conduct when the output current in the resistor exceeds the predetermined value in the first direction.

12. The current limiter of claim 11, further comprising a second resistor, coupled between a power supply and the duplicating transistor.

13. The current limiter of claim 12, wherein the first limitation transistor includes a gate, a source, and a drain and wherein the gate is coupled to a first terminal of the resistor, the source is coupled to a second terminal of the resistor, and the drain is coupled to the gate of the first output transistor.

14. The current limiter of claim 13, wherein the second limitation transistor includes a gate, a source, and a drain and wherein the gate is coupled to the first terminal of the resistor, the source is coupled to the second terminal of the resistor, and the drain is coupled to the diode-connected transistor in the current mirror circuit.

15. The current limiter of claim 14, further comprising an assembly of diodes coupling a gate of the first output transistor to a gate of the second output transistor and a third transistor, coupling the gate of the second output transistor to the input.

16. The current limiter of claim 15, wherein the current limiter is an MOS integrated circuit.

17. The current limiter of claim 15, wherein the current limiter is a BIMOS integrated circuit.

18. The current limiter of claim 11, wherein the isolation transistor is a N-channel transistor having a substrate connected to a most negative power supply for the current limiter.

19. An amplifier circuit, comprising:
 a push-pull amplifier stage including a first output transistor, a second output transistor, an input, and an output;
 a resistor coupled between the output and an output terminal;
 means, coupled between the resistor and the first output transistor, for controlling conduction of the first output transistor so as to reduce an output current supplied by the first output transistor when a current flowing through the resistor exceeds a predetermined value in a second direction; and
 means, including a second limitation transistor and a current mirror circuit, coupled between the resistor and the input, for reducing a current supplied to the input by a differential amplifier when a current flowing through the resistor exceeds the predetermined value in a first direction.

20. The amplifier of claim 19, further comprising means for isolating the current mirror circuit from the input when the current flowing through the resistor is less than the predetermined value in the first direction.

* * * * *